United States Patent
Choi et al.

(10) Patent No.: US 8,134,876 B2
(45) Date of Patent: Mar. 13, 2012

(54) DATA INPUT/OUTPUT APPARATUS AND METHOD FOR SEMICONDUCTOR SYSTEM

(75) Inventors: Hae-Rang Choi, Gyeonggi-do (KR); Yong-Ju Kim, Gyeonggi-do (KR); Jae-Min Jang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 57 days.

(21) Appl. No.: 12/832,312

(22) Filed: Jul. 8, 2010

(65) Prior Publication Data

US 2011/0267117 A1    Nov. 3, 2011

(30) Foreign Application Priority Data

Apr. 28, 2010   (KR) .................. 10-2010-0039566

(51) Int. Cl.
*G11C 7/00* (2006.01)
*G11C 8/00* (2006.01)

(52) U.S. Cl. ............... 365/193; 365/194; 365/233.1; 365/233.11; 365/233.12

(58) Field of Classification Search ............. 365/193, 365/194, 233.1, 233.11, 233.12
See application file for complete search history.

(56) References Cited

U.S. PATENT DOCUMENTS

| | | | | |
|---|---|---|---|---|
| 6,028,816 A * | 2/2000 | Takemae et al. | ............ | 365/233.1 |
| 6,317,369 B1 * | 11/2001 | Kubo et al. | ................ | 365/193 |
| 6,333,875 B1 * | 12/2001 | Shinozaki | ................ | 365/193 |
| 6,385,129 B1 * | 5/2002 | Silvestri | ............... | 365/233.1 |
| 6,466,491 B2 * | 10/2002 | Yanagawa | ............... | 365/193 |
| 6,603,706 B1 * | 8/2003 | Nystuen et al. | ............ | 365/233.1 |
| 6,707,723 B2 * | 3/2004 | Jeong | ............... | 365/193 |
| 6,930,932 B2 * | 8/2005 | Rentschler | ............... | 365/193 |
| 7,180,800 B2 * | 2/2007 | Kim | ................ | 365/193 |
| 7,234,034 B2 * | 6/2007 | Spriggs et al. | ............... | 365/193 |
| 7,269,094 B2 * | 9/2007 | Lin et al. | ............... | 365/193 |
| 7,668,679 B2 * | 2/2010 | Best | ................ | 365/193 |
| 7,688,672 B2 * | 3/2010 | Best et al. | ............... | 365/233.1 |
| 7,839,705 B2 * | 11/2010 | Park | ............... | 365/193 |
| 7,869,287 B2 * | 1/2011 | Searles et al. | ............... | 365/194 |
| 7,872,937 B2 * | 1/2011 | Searles et al. | ............... | 365/193 |
| 7,924,637 B2 * | 4/2011 | Searles et al. | ............... | 365/194 |
| 7,929,361 B2 * | 4/2011 | Searles et al. | ............... | 365/194 |
| 7,961,533 B2 * | 6/2011 | Searles | ............... | 365/193 |
| 7,983,100 B2 * | 7/2011 | Shan et al. | ............... | 365/193 |

FOREIGN PATENT DOCUMENTS

| KR | 100813554 | 3/2008 |
|---|---|---|
| KR | 100845804 | 7/2008 |

OTHER PUBLICATIONS

Notice of Allowance issued from Korean Intellectual Property Office on Jul. 30, 2011.

* cited by examiner

*Primary Examiner* — Trong Phan
(74) *Attorney, Agent, or Firm* — IP & T Group LLP

(57) ABSTRACT

A semiconductor memory device includes: a strobe signal reception unit configured to receive a strobe signal and generate a tracking clock signal; a clock reception unit configured to receive a clock signal and generate an internal clock signal; a plurality of data reception units configured to receive parallel data in accordance with the internal clock signal and generate internal data; and a phase control unit configured to control the phase of the internal clock signal to track the tracking clock signal and to compensate for a variation in the phase of the internal clock signal while the data is received.

31 Claims, 5 Drawing Sheets

DATA INPUT/OUTPUT APPARATUS AND METHOD FOR SEMICONDUCTOR SYSTEM

CROSS-REFERENCE TO RELATED APPLICATIONS

The present application claims priority of Korean Patent Application No. 10-2010-0039566, filed on Apr. 28, 2010, which is incorporated herein by reference in its entirety.

BACKGROUND OF THE INVENTION

Exemplary embodiments of the present invention relate to a data input/output apparatus and method for a semiconductor system, and more particularly, to an apparatus and method for inputting and outputting data at a high speed in a parallel-link transceiver of a semiconductor memory device.

In a system including a plurality of semiconductor memory devices, each of the semiconductor memory devices may be controlled to store data. When a memory controller, for example, a central processing unit (CPU) or the like, is to input data, a semiconductor memory device receives the data and a clock signal from the memory controller, and writes the data into a corresponding memory cell in synchronization with the clock signal.

Figure 1:
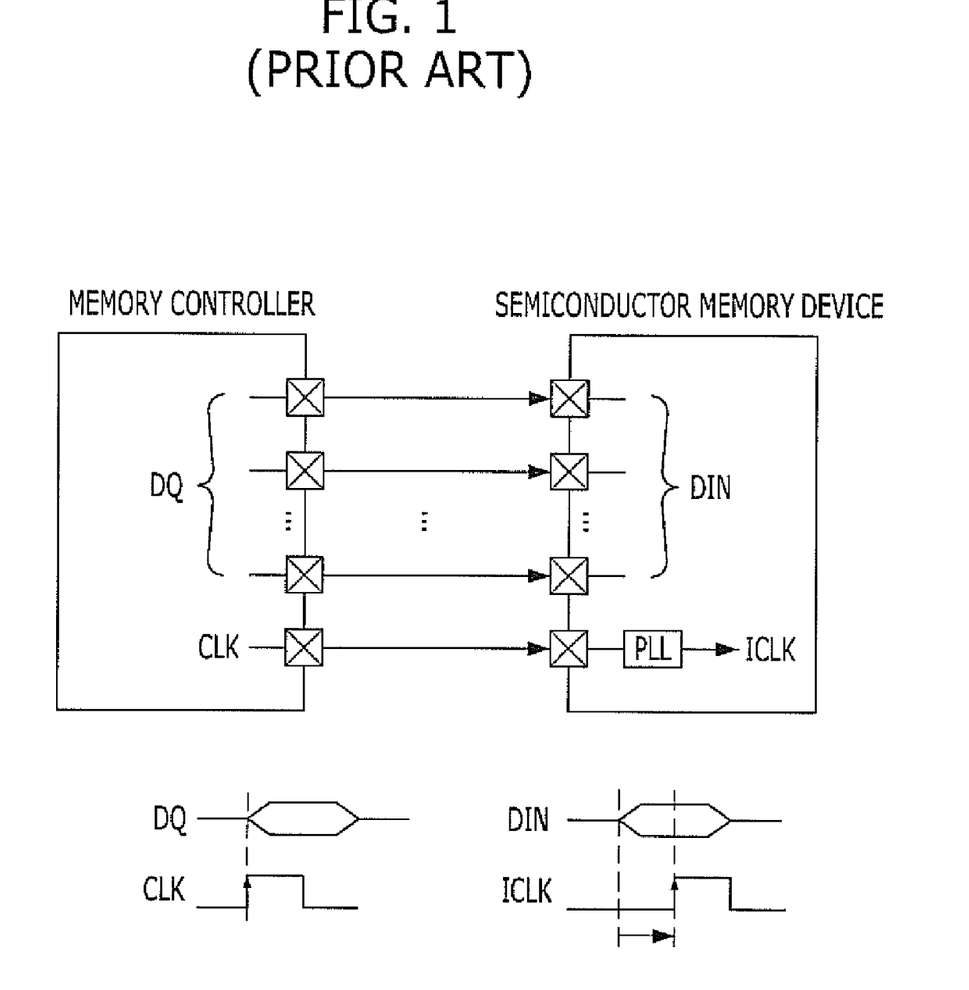
FIG. 1 is a diagram illustrating a conventional semiconductor memory device and a memory controller for controlling the semiconductor memory device.

FIG. 1 is a diagram illustrating a conventional semiconductor memory device and a memory controller for controlling the semiconductor memory device. Specifically, FIG. 1 illustrates a semiconductor memory device for a graphic operation and a graphic process unit (GPU) dedicated to processing image data.

Referring to FIG. 1, a transmission stage of the GPU transmits a plurality of data DQ and a clock signal CLK to the semiconductor memory device.

In a reception stage of the semiconductor memory device, the data inputted from outside are converted into internal data DIN through a variety of control circuits to transmit the data to unit cells, and the clock signal is converted into an internal clock signal ICLK through an internal clock control circuit.

At this time, the circuits for transferring the clock signal, including a phase locked loop (PLL), a clock divider, and a local router, have a longer delay time than the circuits for transferring the data. Therefore, the clock signal CLK outputted from the transmission stage of the GPU is designed in such a manner as to have a rising edge when the data is outputted, and the internal clock signal ICLK used in the reception stage of the semiconductor device is designed in such a manner as to have a rising edge in the center of an effective window of the data.

In a system operating at a high speed, however, the effective window of the data is inevitably reduced. Thus, as the amount of data in a channel between the semiconductor memory device and the GPU increases, the operation time of the data may not coincide with the transition time of the clock signal and data may be received inaccurately.

In addressing such a concern, a semiconductor memory device and a GPU may transfer data between them at a high speed by using data training. The data training refers to technology which controls a skew between data by using a data pattern predefined between the GPU and the semiconductor memory device, in order to stably transfer the data for read and write operations.

A semiconductor memory device for a graphic operation may be designed to transfer data at a speed of 4 Gbps or more by using data training. In order to improve the reliability of a high-speed operation, a semiconductor memory device for a graphic operation often includes the data training as a part of its features.

Figure 2:
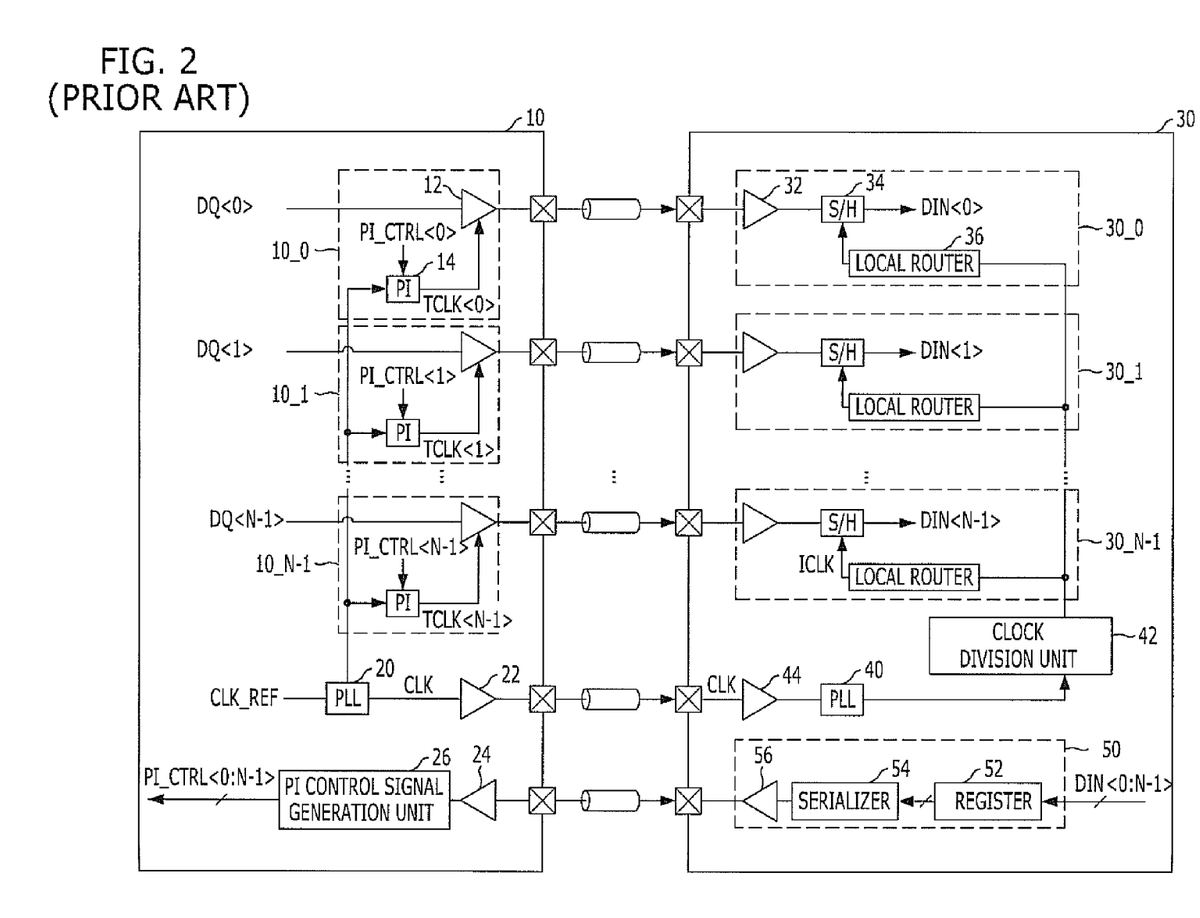
FIG. 2 is a circuit diagram illustrating data training for in a parallel link of a conventional semiconductor system.

FIG. 2 is a circuit diagram explaining data training which is used in parallel links of a conventional semiconductor system. Hereafter, data input/output between a memory controller 10 and a semiconductor memory device 30 of the semiconductor system will be described.

Referring to FIG. 2, the memory controller 10 of the semiconductor system includes a plurality of transmission units 10_0 to 10_N−1 and a first clock generation unit 20.

The number of the transmission units 10_0 to 10_N−1 corresponds to the number of parallel data DQ<0:N−1>, and are configured to transmit the corresponding parallel data DQ<0:N−1>.

Each of the transmission units 10_0 to 10_N−1 includes a transmitter 12 and a phase interpolator (PI) 14. The transmitter 12 is configured to transmit the corresponding data to the semiconductor memory device 30. The phase interpolator (PI) 14 is configured to generate a training clock signal TCLK<0:N−1> for controlling the output time of the data outputted from the transmitter 12, that is, the phase of the data in accordance with a multi-phase clock signal PLL_CLK<0:M> and a phase control signal PI_CTRL<0:N−1>. The phase control signal PI_CTRL<0:N−1> is a signal which is generated in accordance with the data training.

The first clock generation unit 20 is configured to generate the multi-phase clock signals PLL_CLK<0:M> in response to a reference clock signal CLK_REF and supply the multi-phase clock signals PLL_CLK<0:M> to the respective transmission units 10_0 to 10_N−1. Furthermore, the first clock generation unit 20 generates a clock signal CLK to be transmitted to the semiconductor memory device 30, in response to the reference clock signal CLK_REF. Here, a transmitter 22 is configured to buffer and output the clock signal CLK outputted from the first clock generation unit 20.

The memory controller 10 additionally includes a transmitter 24 and a PI control signal generation unit 26 to generate the phase control signals PI_CTRL<0:N−1> in accordance with the data training. The transmitter 24 is configured to receive a training result inputted from the semiconductor memory device 30. The PI control signal generation unit 26 is configured to generate the phase control signals PI_CTRL<0:N−1> depending on the received training result.

Meanwhile, the semiconductor memory 30 includes a plurality of reception units 30_0 to 30_N−1, a second clock generation unit 40, and a clock division unit 42.

The number of reception units 30_0 to 30_N−1 corresponds to the number of parallel data DQ<0:N−1>, and are configured to receive the corresponding parallel data DQ<0:N−1> to generate internal data DIN<0:N−1>.

Each of the reception units 30_0 to 30_N−1 includes a receiver 32, a sample holder (S/H) 34, and a local router 36. The receiver 32 is configured to receive data inputted from the corresponding transmitter of the memory controller 10. The sample holder 34 is configured to sample an output of the receiver 32 in accordance with the internal clock signal ICLK. The local router 36 is configured to route the inputted internal clock signal ICLK and provide the internal clock signal ICLK to the sample holder 34.

The second clock generation unit 40 is configured to receive the clock signal CLK to generate the internal clock signal ICLK. In the previous stage of the second clock generation unit 40, a receiver 44 is additionally provided to receive the clock signal CLK inputted from the memory controller 10.

The clock division unit 42 is configured to divide the internal clock signal ICLK outputted from the second clock generation unit 40 and provide the divided internal clock signal ICLK to each local router 36 of the reception units 30_0 to 30_N−1.

The semiconductor memory device 30 further includes a data training unit 50 configured to perform the data training.

The data training unit 50 includes a register 52, a serializer 54, and a transmitter 56. The register 52 is configured to receive and store the internal data DIN<0:N−1> outputted from the plurality of reception units 30_0 to 30_N−1. The serializer 54 is configured to serialize and output the parallel internal data DIN<0:N−1> stored in the register 52. The transmitter 56 is configured to output the output of the serializer 54 to the transmitter 24 of the memory controller 10.

Hereafter, the data training between the memory controller 10 and the semiconductor memory device 30 will be described with reference to the above-described configurations. Here, an independent command may be inputted to perform the data training, before an input/output operation of data. Hereafter, a period before an independent command is inputted to perform the input/output operation of data is referred to as an initial period.

During the initial period, the respective PIs 14 inside the plurality of transmission units 10_0 to 10_N−1 of the memory controller 10 are initialized. Therefore, the plurality of transmission units 10_0 to 10_N−1 transmit the parallel data DQ<0:N−1> and the clock signal CLK to the semiconductor memory device 30, without the phase control by the phase interpolators (PIs) 14.

The memory semiconductor device 30 generates the internal clock signal ICLK in accordance with the clock signal CLK, and receives the parallel data DQ<0:N−1> in accordance with the internal clock signal ICLK to generate the internal data DIN<0:N−1>. The data training unit 50 receives the internal data DIN<0:N−1>, serializes the internal data DIN<0:N−1>, and transmits the serialized internal data to the memory controller 10.

The PI control signal generation unit 26 of the memory controller 10 receives the serialized data to generate the phase control signals PI_CTRL<0:N−1>, and the phase interpolators (PIs) 14 inside the respective transmission units 10_0 to 10_N−1 generate training clock signals TCLK<0:N−1> in accordance with the phase control signals PI_CTRL<0:N−1>, and control the phases of the data outputted from the transmission units 10_0 to 10_N−1.

Through the data training process, the rising edge of the internal clock signal ICLK of the semiconductor memory device 30 is positioned in the center of the effective window of the internal data DIN<0:N−1>. During the transmission and reception period of the data, the semiconductor memory device 30 samples the data in the center of the effective window of the data in accordance with the internal clock signal ICLK. Therefore, the semiconductor memory device 30 may normally transmit and receive the data to and from the memory controller 10.

In the conventional memory system, however, the data training is performed during the initial period. Therefore, when delay is generated by the internal control circuits while the data are transmitted and received outside the initial period, it is difficult to compensate for the delay. Accordingly, as the transition time of the internal clock signal deviates from the effective window of the data, data may be sampled inaccurately.

In particular, when the temperature or power supply voltage varies during the operation, the clock signal having a different transmission path from the data may have a different delay value and thus the sampling timing of the semiconductor memory device 30 may vary and deviate from the center of the effective window of the data. As the operation frequency of the semiconductor memory device increases, the above-described situation may frequently occur and cause malfunctions.

Here, as the data transmission rate increases, the clock frequency also increases. For example, a semiconductor memory device having a data transmission rate of one Gb/s (giga bits/sec) or more has a clock frequency of one GHz (giga hertz) or more. However, at such a clock frequency, it is difficult to divide the clock signal and to discriminate the data on the chip. Therefore, a method for inputting and outputting data and a clock signal effectively without an error may be useful.

SUMMARY OF THE INVENTION

An embodiment of the present invention is directed to a data input/output apparatus and method of a semiconductor memory system, which is capable of increasing the reliability of data transfer in a semiconductor memory device which samples data within the range of an effective window by tracking a strobe signal with an internal clock signal even while the data is transmitted and received, and thus operates at a high speed.

Another embodiment of the present invention is directed to a data input/output apparatus and method of a semiconductor memory system, which enables a reception stage of a semiconductor memory device to sample data in the center of an effective window of data, even though the timing of an internal clock signal of the semiconductor memory device is varied in accordance with changes in power supply voltage and temperature during the operation.

Another embodiment of the present invention is directed to a data input/output apparatus and method of a semiconductor memory system, which is capable of minimizing the number of circuits for a training operation of a strobe signal inside a semiconductor memory device to thereby transmit and receive the strobe signal effectively without an error, and satisfying demand for a small area which is required by a high-integrated semiconductor and an electronic apparatus and system.

In accordance with an embodiment of the present invention, a semiconductor memory device includes: a strobe signal reception unit configured to receive a strobe signal and generate a tracking clock signal; a clock reception unit configured to receive a clock signal and generate an internal clock signal; a plurality of data reception units configured to receive parallel data in accordance with the internal clock signal and generate internal data; and a phase control unit configured to control the phase of the internal clock signal to track the tracking clock signal and to compensate for a variation in the phase of the internal clock signal while the data is received.

The phase control unit may include: a tracking section configured to determine a tracking of the tracking clock signal by the internal clock signal, and output an internal clock control signal depending on the tracking determination; and a phase control section configured to control the phase of the internal clock signal in accordance with the internal clock control signal.

The tracking section may receive an internal clock signal inputted to a data reception unit of the plurality of data reception units. The data reception unit may be a data reception unit which is positioned physically closest to the strobe signal reception unit, among the plurality of data reception units.

In accordance with another embodiment of the present invention, there is provided a semiconductor system including first and second semiconductor chips for transmitting and receiving data. The first semiconductor chip includes: a plurality of data transmission units configured to output a plurality of parallel data; a clock transmission unit configured to output a clock signal; and a strobe signal transmission unit configured to output a strobe signal. The second semiconductor chip includes: a strobe signal reception unit configured to receive the strobe signal and generate a tracking clock signal; a clock reception unit configured to receive the clock signal and generate an internal clock signal; a plurality of data reception units configured to receive the parallel data in accordance with the internal clock signal and generate internal data; and a phase control unit configured to control the phase of the internal clock signal to track the tracking clock signal.

In accordance with yet another embodiment of the present invention, a data input/output method for a semiconductor system, which transmits and receives data between first and second semiconductor chips, includes: transmitting a plurality of parallel data, a clock signal, and a strobe signal from the first semiconductor chip to the second semiconductor chip; receiving the strobe signal and generating a tracking clock signal; receiving the clock signal and generating an internal clock signal; receiving the parallel data in accordance with the internal clock signal and generating internal data; and controlling the phase of the internal clock signal to track the tracking clock signal and compensating for a variation in the phase of the internal clock signal while the data is transmitted and received.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
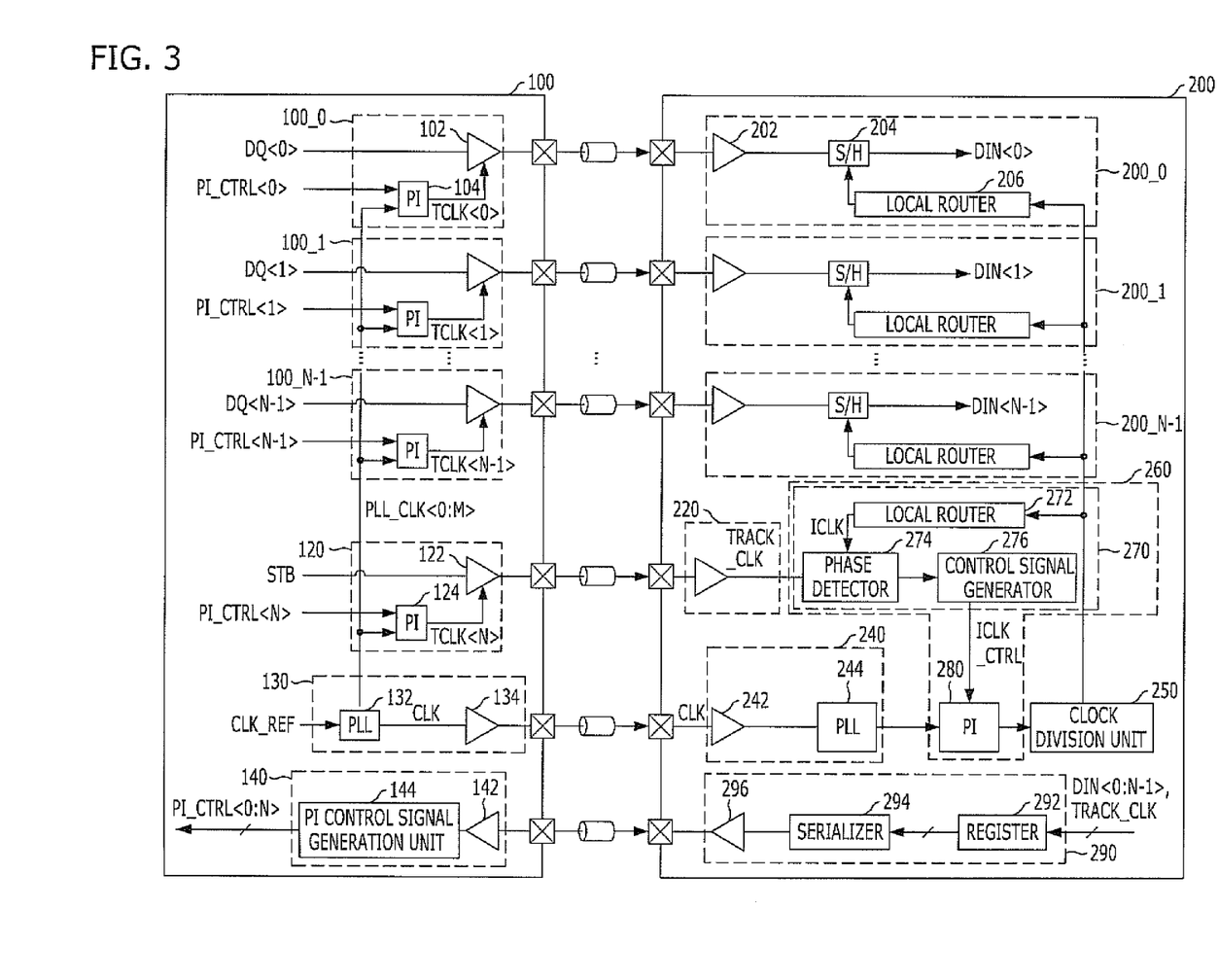
FIG. 3 is a block diagram explaining a data input/output apparatus of a semiconductor system in accordance with a first embodiment of the present invention.

FIG. 3 is a block diagram illustrating a data input/output apparatus of a semiconductor system in accordance with a first embodiment of the present invention.

The semiconductor system in accordance with the first embodiment of the present invention receives a strobe signal STB as well as N parallel data DQ<0:N−1>. A clock signal CLK is inputted and outputted between a transmission stage of a memory controller 100 and a reception stage of a semiconductor memory device 200.

Referring to FIG. 3, the memory controller 100 includes a plurality of data transmission units 100_0 to 100_N−1, a strobe signal transmission unit 120, and a clock transmission unit 130.

The number of the plurality of transmission units 100_0 to 100_N−1 corresponds (for example, matches) to the number of the parallel data DQ<0:N−1>, and the plurality of transmission units 100_0 to 100_N−1 are configured to transmit the corresponding parallel data DQ<0:N−1>.

More specifically, each of the transmission units includes a data transmitter 102 and a phase interpolator (PI) 104. The data transmitter 102 is configured to receive and transfer the parallel data DQ<0:N−1>. The phase interpolator (PI) 104 is configured to generate a training clock signal TCLK<0:N−1> for controlling the phase of data outputted from the data transmitter 102 in response to a multi-phase clock signal PLL_CLK<0:M> and a phase control signal PI_CTRL<0:N−1>. The phase control signal PI_CTRL<0:N−1> is a signal which is generated in accordance with the data training which is performed during the initial period before the input/output of the data is performed in response to an inputted command.

The strobe signal transmission unit 120 is configured to transmit a strobe signal STB generated inside the memory controller 110 in response to the multi-phase clock signal PLL_CLK<0:M> and a phase control signal PI_CTRL<N>.

More specifically, the strobe signal transmission unit 120 includes a strobe signal transmitter 122 and a strobe signal PI 124.

The strobe signal transmitter 122 is configured to receive the strobe signal STB generated inside the memory controller 100 and transfer the strobe signal STB. The strobe signal PI 124 is configured to generate a training clock signal TCLK<N> for controlling the phase of the strobe signal outputted from the strobe signal transmitter 122, in response to the multi-phase clock signal PLL_CLK<0:M> and the phase control signal PI_CTRL<N>. The phase control signal PI_CTRL<N> is a signal which is generated in accordance with the data training which is performed during the initial period before the input/output of the data is performed in response to an inputted command.

The clock transmission unit 130 is configured to generate the multi-phase clock signal PLL_CLK<0:M> in response to a reference clock signal CLK_REF and generate a clock signal CLK to transmit to the semiconductor memory device 200.

More specifically, the clock transmission unit 130 includes a first clock generation section 132 and a clock transmitter 134. The first clock generation section 132 is configured to generate the multi-phase clock signals PLL_CLK<0:M> in response to the reference clock signal CLK_REF and supply the generated multi-phase clock signals PLL_CLK<0:M> to the respective transmission units 100_0 to 100_N−1. Furthermore, the first clock generation section 132 generates the clock signal CLK to be transmitted to the semiconductor memory device 200, in response to the reference clock signal CLK_REF. At this time, the multi-phase clock signals PLL_CLK<0:M> may be signals which are generated by changing the phase of the clock signal CLK. The first clock generation section 132 may include a phase locked loop (PLL) circuit or a delay locked loop (DLL) circuit. The clock transmitter 134 is configured to buffer and output the clock signal CLK outputted from the first clock generation section 132.

The memory controller 100 further includes a training control unit 140 configured to perform the data training during the initial period before the input/output of the data is performed in response to an inputted command.

The training control unit 140 is configured to receive serial training data inputted from the semiconductor memory device 200 during the initial period and generate the phase control signals PI_CTRL<0:N>.

More specifically, the training control unit 140 includes a receiver 142 and a PI control signal generation section 144. The receiver 142 is configured to receive the serial training data inputted from the semiconductor memory device 200. The PI control signal generation section 144 is configured to generate the phase control signals PI_CTRL<0:N> in accordance with the serial training data which are received as a result of the data training which is performed during the initial period.

Meanwhile, the semiconductor memory device 200 includes a plurality of data reception units 200_0 to 200_N−1, a strobe signal reception unit 220, a clock reception unit 240, a clock division unit 250, and a phase control unit 260.

The plurality of data reception units 200_0 to 200_N−1 are configured to receive the parallel data DQ<0:N−1> outputted from the plurality of transmission units 100_0 to 100_N−1 and generate internal data DIN<0:N−1>. The number of the plurality of data reception units 200_0 to 200_N−1 corresponds (for example, matches) to the number of the parallel data DQ<0:N−1>.

More specifically, each of the data reception units 200_0 to 200_N−1 includes a data receiver 202, a sample holder S/H 204, and a local router 206. The data receiver 202 is configured to receive the corresponding parallel data DQ<0:N−1>. The sample holder 204 is configured to sample the output of the data receiver 202 in accordance with the internal clock signal ICLK. The local router 206 is configured to route the inputted internal clock signal ICLK and provide the internal clock signal ICLK to the sample holder 204.

The strobe signal reception unit 220 is configured to receive the strobe signal STB transmitted from the memory controller 100 and output a tracking clock signal TRACK_CLK.

The clock reception unit 240 is configured to receive the clock signal CLK outputted from the clock transmission unit 130 and generate the internal clock signal ICLK. In particular, the clock reception unit 240 controls the phase in accordance with the internal clock control signal ICLK_CTRL.

More specifically, the clock reception unit 240 includes a clock receiver 242 and a second clock generation section 244. The clock receiver 242 is configured to receive the clock signal CLK transmitted from the memory controller 100. The second clock generation section 244 is configured to receive the clock signal CLK outputted from the clock receiver 242 and generate clock signals having multiple phases. The second clock generation section 244 may include a PLL or DLL.

In order to compensate for the shifted phase of the internal clock signal ICLK inside the semiconductor memory device during the input/output of the data, the phase control unit 260 is configured to control the phase of the internal clock signal ICLK to track the tracking clock signal TRACK_CLK.

More specifically, the phase control unit 260 includes a tracking section 270 and a phase control section 280. The tracking section 270 is configured to track the tracking clock TRACK_CLK outputted from the strobe signal reception unit 220 with the internal clock signal ICLK and generate the internal clock control signal ICLK_CTRL. The phase control section 280 is configured to receive the clock signals outputted from the second clock generation section 244, control the phases of the clock signals in accordance with the internal clock control signal ICLK_CTRL, and generate the internal clock signal ICLK. The phase control section 280 may include a phase interpolator (PI).

More specifically, the tracking section 270 includes a local router 272, a phase detector 274, and a control signal generator 276. The local router 272 is configured to route the internal clock signal ICLK and provide the internal clock signal ICLK to the phase detector 274. The phase detector 274 is configured to compare the phase of the internal clock signal ICLK inputted from the local router 272 with the phase of the tracking clock signal TRACK_CLK outputted from the strobe signal reception unit 220. The control signal generator 276 is configured to generate the internal clock control signal ICLK_CTRL depending on the comparison result of the phase detector 274.

The clock division unit 250 is configured to divide the internal clock signal ICLK outputted from the clock reception unit 240 and provide the divided internal clock signal to respective local routers of the data reception units 200_0 to 200_N−1.

The semiconductor memory device 200 further includes a data training unit 290 configured to perform the data training for compensating for a skew existing in a path connected between the memory controller 100 and the semiconductor memory device 200 during the initial period before the input/output of the data is performed in response to an inputted command after the initial period.

In particular, in the data training unit 290 in accordance with the first embodiment of the present invention, the data training unit 290 receives the tracking clock signal TRACK_CLK and the internal data DIN<0:N−1> and transmits the tracking clock signal TRACK_CLK and the internal data DIN<0:N−1> to the training control unit 140 of the memory controller 100 during the initial operation.

More specifically, the data training unit 290 includes a register 292, a serializer 294, and a transmitter 296. The register 292 is configured to receive and store the internal data DIN<0:N−1> outputted from the plurality of data reception units 200_0 to 200_N−1 and the tracking clock signal TRACK_CLK outputted from the strobe signal reception unit 220. The serializer 294 is configured to serialize and output the parallel internal data DIN<0:N−1> and the tracking clock signal TRACK_CLK stored in the register 292. The transmitter 296 is configured to receive the output of the serializer 294 and output the serial training data to the receiver 142 of the memory controller 100.

Hereafter, the data training between the memory controller 100 and the semiconductor memory device 200 in accordance with the first embodiment of the present invention will be described with reference to FIG. 4.

Figure 4:
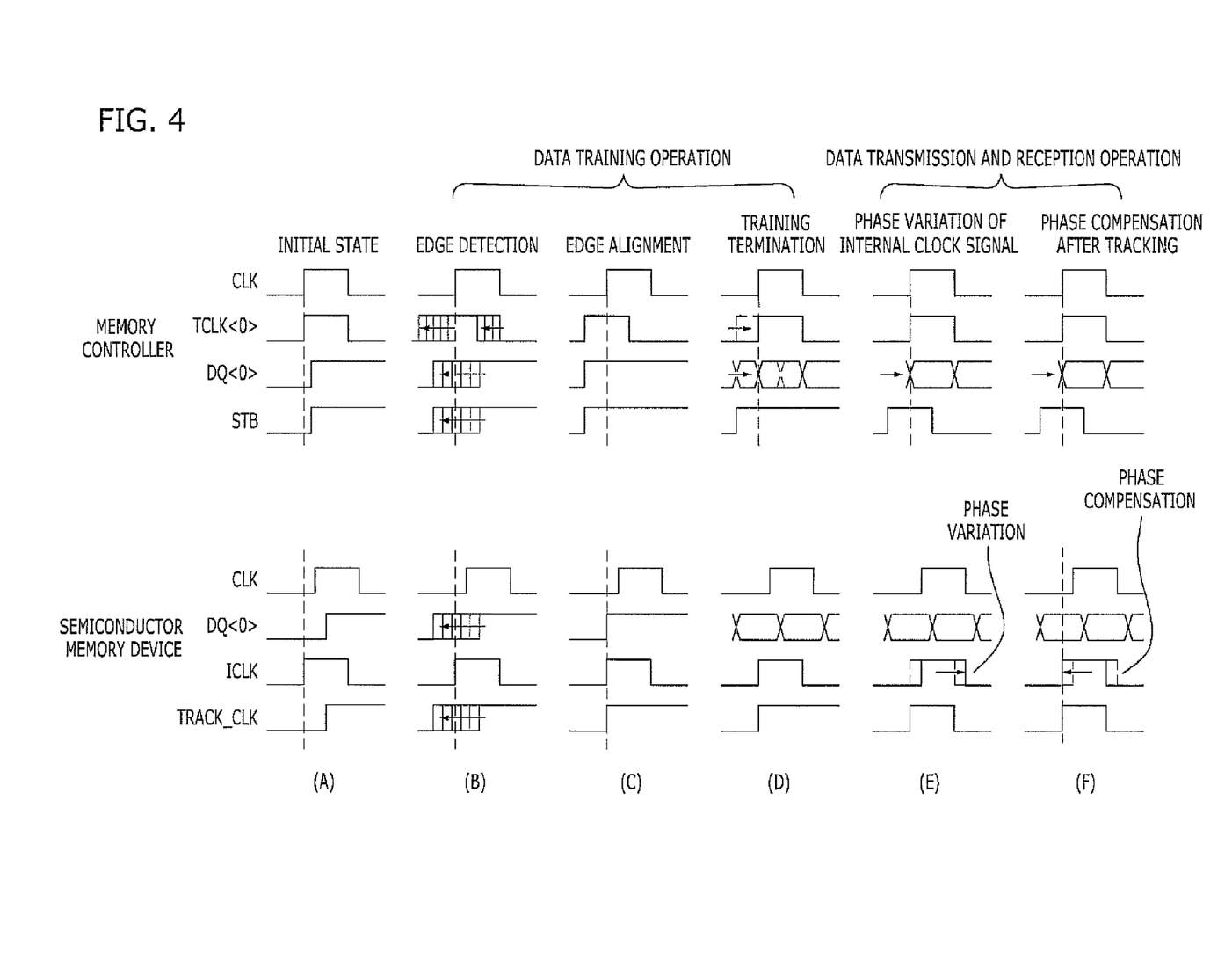
FIG. 4 is a timing diagram illustrating a data input/output method of the semiconductor system in accordance with the first embodiment of the present invention.

FIG. 4 is a timing diagram illustrating a data input/output method of the semiconductor system in accordance with the first embodiment of the present invention. For illustration purposes, FIG. 4 shows a case in which the first parallel data DQ<0> is trained.

Referring to (A) in FIG. 4, the respective PIs inside the plurality of data transmission units of the memory controller are initialized during the initial period. Accordingly, the training clock signals TCLK outputted by the phase interpolators (PIs) are also initialized. Therefore, the plurality of data transmission units of the memory controller transmit the parallel data DQ, the clock signal CLK, and the strobe signal STB to the semiconductor memory device, without the phase control by the phase interpolators (PIs). At this time, the parallel data DQ may be outputted in a state in which the phases thereof are varied at a constant interval between each pair of adjacent phases. For example, when 36 data are outputted, the respective data may be outputted in such a manner that a phase difference of 10 degrees is provided between each pair of adjacent phases. Therefore, the phases of the data may be varied by, for example, a portion or the entire period of the clock signal CLK.

Referring to (B) in FIG. 4, before an independent command is inputted to perform the input/output operation of the data, the data training is performed to compensate for a skew existing in a path connected between the memory controller and the semiconductor memory device. The respective data reception units (200_0 to 200_N−1 shown in FIG. 3) of the semiconductor memory device receive the parallel data DQ in accordance with the internal clock signal ICLK and generate the internal data. Similarly, the strobe signal reception unit (220 shown in FIG. 3) receives the strobe signal STB and outputs the tracking clock signal TRACK_CLK. The data training unit (290 shown in FIG. 3) receives the internal data and the tracking clock signal TRACK_CLK, serializes the internal data and the tracking clock signal TRACK_CLK, and transmits the serial training data to the memory controller.

Referring to (C) in FIG. 4, the training control unit (140 shown in FIG. 3) of the memory controller receives the serial training data to generate (N+1) phase control signals. The phase interpolators (PIs) inside the respective data transmission units (100_0 to 100_N−1 shown in FIG. 3) control the phases of the data DQ outputted from the data transmission units by controlling the training clock signal TCLK in accordance with the N phase control signals (PI_CTRL<0:N−1> shown in FIG. 3). Furthermore, the strobe signal phase interpolator PI (124) inside the strobe signal transmission unit (120 shown in FIG. 3) controls the phase of the strobe signal STB by controlling the training clock TCLK in accordance with the phase control signal PI_CTRL<N>.

Through the above-described process, the edges of the internal data DIN are aligned with a rising edge of the internal clock signal ICLK, and a rising edge of the strobe signal STB is also aligned with the rising edge of the internal clock signal ICLK.

Referring to (D) in FIG. 4, when the data training is terminated, the memory controller shifts the phase of the training clock signal TCLK and the phase of the parallel data DQ outputted in accordance with the training clock signal TCLK, by 0.25*tCK (tCK=one clock cycle) or 90 degrees. Therefore, the rising edges of the internal clock signal ICLK and the strobe signal STB of the semiconductor memory device are positioned in the center of the effective window of the internal data DIN. Accordingly, the internal clock signal ICLK and the strobe signal STB may have a maximum variation range of tCK/2 within the effective window of the internal data DIN.

Referring to (E) in FIG. 4, while the data is normally transmitted and received between the memory controller and the semiconductor memory device, the transmission stage of the memory controller transmits the clock signal CLK, the data DQ, and the strobe signal STB. The respective reception units of the semiconductor memory device receive the clock signal CLK, the data DQ, and the strobe signal STB which are transmitted from the memory controller. At this time, the rising edge of the strobe signal STB is aligned with the center of the effective window of the data.

If the phase of the internal clock signal ICLK of the semiconductor memory device is varied by changes in power supply voltage and temperature, the phase control unit (260 shown in FIG. 3) of the semiconductor memory device tracks the phase of the internal clock signal ICLK which is fed back by the clock division unit (250 shown in FIG. 3) and the respective local routers, based on the phase of the strobe signal STB, and generates the internal clock control signal ICLK_CTRL.

Referring to (F) in FIG. 4, the phase control section (e.g., 260 shown in FIG. 3) of the clock reception unit re-controls the phase of the internal clock signal ICLK in accordance with the internal clock control signal ICLK_CTRL such that the phase of the internal clock signal ICLK is equalized to the phase of the tracking clock signal TRACK_CLK, and outputs the internal clock signal ICLK to the clock division unit (250 shown in FIG. 3). Therefore, the data may be sampled within the range of the effective window.

In the semiconductor system in accordance with the first embodiment of the present invention, the strobe signal (e.g., STB in FIG. 3) as well as the N parallel data (e.g., DQ<0:N−1> in FIG. 3) and the clock signal (e.g., CLK in FIG. 3) is inputted and outputted between the transmission stage of the memory controller and the reception stage of the semiconductor memory device. Therefore, during the period before an independent command is inputted to perform the input/output operation of the data, the internal clock signal used in the reception stage of the semiconductor memory device is set in such a manner as to have a rising edge in the center of the effective window of the data, through the data training. Furthermore, the strobe signal STB is controlled in such a manner that the rising edge thereof is aligned with the center of the effective window of the data. After that, although the timing of the internal clock signal (e.g., ICLK in FIG. 3) of the semiconductor memory device is varied by delay of the internal circuit or a change in power supply voltage or temperature during the transmission and reception of the data, the internal clock signal (e.g., ICLK in FIG. 3) is re-controlled in real time to track the strobe signal, only when the phase of the internal clock signal is distorted. Then, the rising edge of the internal clock signal (e.g., ICLK in FIG. 3) may be aligned at a desired position inside the effective window of the internal data. That is, since the information about the center of the effective window of the data exists at the edge of the strobe signal, the data (e.g., DQ<0:N−1> in FIG. 3) may be sampled within the effective window of the data by adjusting the internal clock in accordance with the strobe signal.

Figure 5:
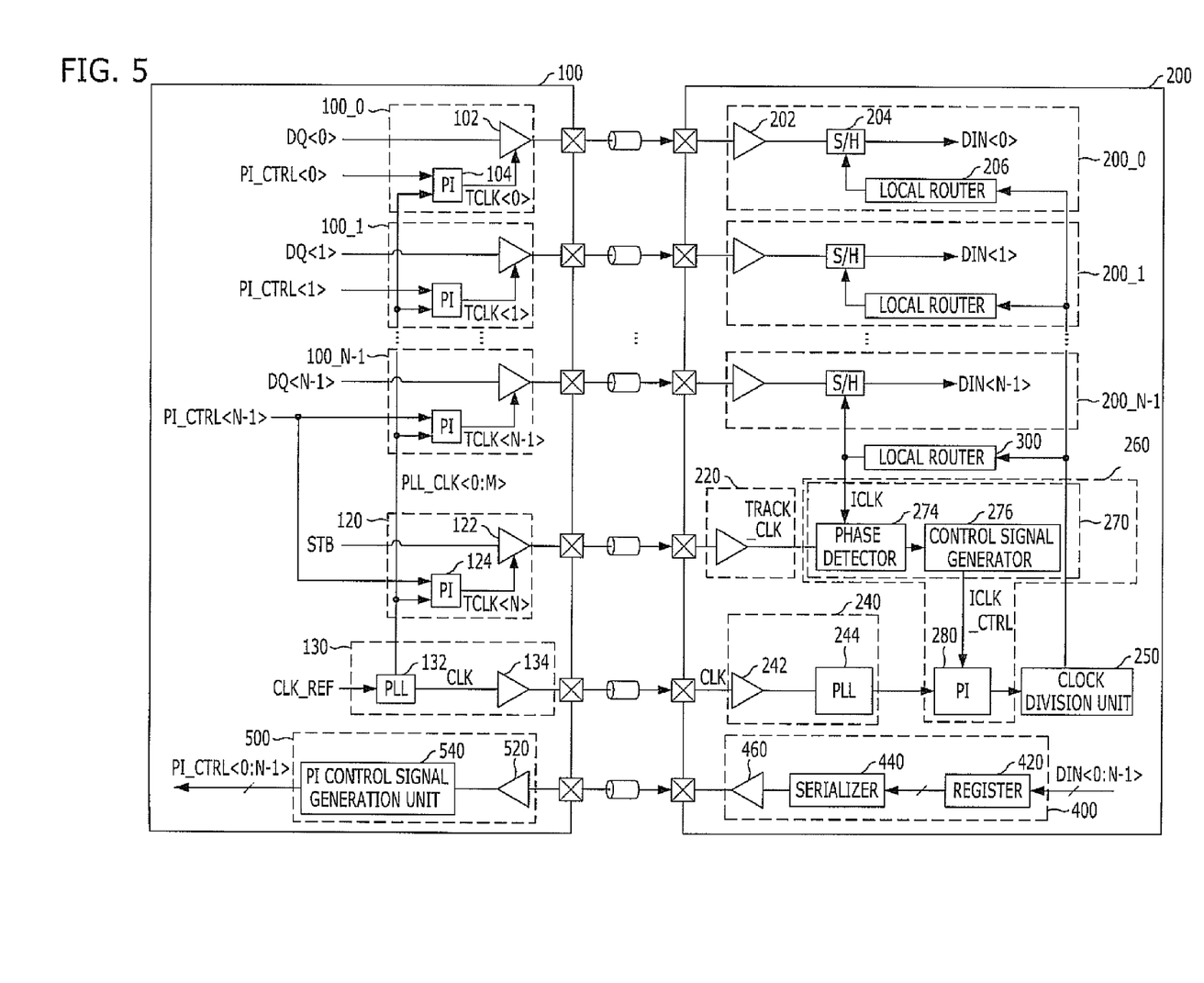
FIG. 5 is a block diagram illustrating a data input/output apparatus of a semiconductor system in accordance with a second embodiment of the present invention.

FIG. 5 is a block diagram illustrating a data input/output apparatus of a semiconductor system in accordance with a second embodiment of the present invention. Hereafter, like reference numerals will be given to the same components as those of the first embodiment of the present invention, and new reference numerals will be given only to new components. Furthermore, the detailed descriptions of the same components will be omitted.

In the semiconductor system in accordance with the second embodiment of the present invention, a strobe signal may be transmitted and received effectively without an error, even though the number of circuits for data training of the strobe signal is minimized.

Referring to FIG. 5, one data reception unit among a plurality of data reception units 200_0 to 200_N−1 inside a semiconductor memory device 200 in accordance with the second embodiment of the present invention is selected, and the selected data reception unit and the phase control unit 260 shares a local router 300. That is, an internal clock signal ICLK inputted to the selected data reception unit is fed back to the phase detector 274 of the phase control unit 260.

Furthermore, a phase interpolator (PI) inside a data transmission unit of the memory controller 100, which is connected to the selected data reception unit, shares a phase control signal with the phase interpolator (PI) of the strobe signal transmission unit 120.

The selected data reception unit may be a data reception unit which is positioned physically the closest to the phase control unit 260. According to an example, the selected data reception unit may receive the least significant bit (LSB) or most significant bit (MSB) of parallel data.

Referring to FIG. 5, the phase control unit 260 and the data reception unit 200_N-1 receiving the MSB of the parallel data (that is, the data DQ<N-1>) receive the internal clock signal ICLK from the shared local router 300. Furthermore, the phase interpolator (PI) of the data transmission unit 100_N-1 of the memory controller 100, which is connected to the selected data reception unit 200_N-1, shares a phase control signal PI_CTRL<N-1> with the phase interpolator (PI) 124 inside the strobe signal transmission unit 120.

In the second embodiment of the present invention, a data training unit 400 for performing a data training operation of the semiconductor memory device 200 is configured to receive internal data DIN<0:N-1> and transmit the internal data to a training control unit 500 of the memory controller 100 during the initial operation.

More specifically, the data training unit 400 includes a register 420, a serializer 440, and a transmitter 460. The register 420 is configured to receive and store the internal data DIN<0:N-1> outputted from the plurality of data reception units 200_0 to 200_N-1. The serializer 440 is configured to serialize and output the parallel internal data DIN<0:N-1> stored in the register 420. The transmitter 460 is configured to receive the output of the serializer 440 and output the serial training data to the training control unit 500 of the memory controller 100.

The training control unit 500 of the memory controller 100 is configured to receive the serial training data inputted from the semiconductor memory device 200 and generate the phase control signals PI_CTRL<0:N-1>. At this time, the phase interpolator (PI) of the data transmission unit 100_N-1 of the memory controller 100 shares the phase control signal PI_CTRL<N-1> with the phase interpolator (PI) 124 inside the strobe signal transmission unit 120, where the N phase control signals PI_CTRL<0:N-1> are generated.

More specifically, the training control unit 500 includes a transmitter 520 and a PI control signal generation unit 540. The transmitter 520 is configured to receive the serial training data inputted from the semiconductor memory device 200. The PI control signal generation unit 540 is configured to generate the N phase control signals PI_CTRL<0:N-1> in accordance with the serial training data received as a result of the data training which is performed during the initial period.

Hereafter, the data training between the memory controller 100 and the semiconductor memory device 200 in accordance with the second embodiment of the present invention is described with reference to the above-described configuration.

During the initial period, the respective phase interpolators (PIs) inside the plurality of data transmission units of the memory controller are initialized. Accordingly, training clock signals TCLK outputted by the phase interpolators (PIs) are initialized. Therefore, the plurality of transmission units 100_0 to 100_N-1 of the memory controller transmit the parallel data DQ, the clock signal CLK, and the strobe signal STB to the semiconductor memory device, without the phase control by the phase interpolators (PIs). At this time, the parallel data DQ may be outputted in a state in which the phases of the parallel data DQ are varied at a constant interval. For example, when 36 data are outputted, the respective data may be outputted in such a manner that a phase difference of 10 degrees is provided between each pair of adjacent phases.

Therefore, the phases of the data may be varied by, for example, a portion or the entire period of the clock signal CLK.

Then, before an independent command is inputted to perform the input/output of the data, the data training is performed to compensate for a skew existing in a path connected between the memory controller and the semiconductor memory device. The respective data reception units 200_0 to 200_N-1 of the semiconductor memory device receive the parallel data DQ in accordance with the internal clock signal ICLK and generate the internal data DIN. Similarly, the strobe signal reception unit 220 receives the strobe signal STB and generates a tracking clock signal TRACK_CLK. The data training unit 400 receives the internal data DIN and the tracking clock signal TRACK_CLK, serializes the internal data DIN and the tracking clock signal TRACK_CLK, and then transmits the serial training data to the memory controller.

The training control unit 500 of the memory controller receives the serial training data to generate N phase control signals PI_CTRL<0:N-1>. The phase interpolators (PIs) inside the respective data transmission units 100_0 to 100_N-1 control the phases of the data DQ outputted from the data transmission units 100_0 to 100_N-1 by controlling the training clock signals TCLK in accordance with the N phase control signals PI_CTRL<0:N-1>. Similarly, the phase interpolator (PI) inside the strobe signal transmission unit 120 controls the phase of the strobe signal STB by controlling the training clock the training clock signal TCLK in accordance with one of the N phase control signals.

In the second embodiment of the present invention, the training control unit 520 controls the phase interpolator (PI) inside the strobe signal transmission unit 120 by using the phase control signal PI_CTRL<N-1> inputted to the data transmission unit 100_N-1 connected to the data line of parallel data, which data line is positioned physically the closest, for example, the data line DQ<N-1>.

Through the above-described process, the rising edge of the internal clock signal ICLK is aligned with the rising edge of the internal data DIN, and the rising edge of the strobe signal STB is aligned with the rising edge of the internal clock signal ICLK.

When the data training is terminated, the memory controller shifts the phases of the training clock signals TCLK and the phase of the parallel data DQ outputted in accordance with the training clock signals TCLK, by 0.25*tCK or 90 degrees. Therefore, the rising edges of the internal clock signal ICLK and the strobe signal STB of the semiconductor memory device are positioned in the center of the effective window of the internal data DIN, and the internal clock signal ICLK and the strobe signal STB may have a maximum variation range of tCK/2 within the effective window of the internal data DIN.

After that, while the data is normally transmitted and received between the memory controller and the semiconductor memory device, the transmission stage of the memory controller transmits the clock signal CLK, the data DQ, and the strobe signal STB of which the rising edge is aligned with the center of the effective window of the data. The respective reception units of the semiconductor memory device receive the clock signal CLK, the data DQ, and the strobe signal STB, which are transmitted from the memory controller.

If the phase of the internal clock signal ICLK of the semiconductor memory device is varied by changes in power supply voltage and temperature, the phase control unit 260 of the semiconductor memory device generates the internal clock control signal ICLK_CTRL by adjusting the phase of the internal clock signal ICLK which is fed back by the clock division unit 250 and the local router 300, based on the phase of the strobe signal STB. In the second embodiment of the present invention, the fed-back internal clock signal ICLK is a signal which is outputted from the shared local router 300 of the data reception unit 200_1 receiving the MSB (DQ<N−1>) of the parallel data which is positioned physically the closest to the phase control unit 260.

The phase control section of the clock reception unit re-controls the phase of the internal clock signal ICLK in accordance with the internal clock control signal ICLK_CTRL, and outputs the internal clock signal ICLK to the clock division unit 250. Therefore, data may be sampled in the range of the effective window.

As described above, during the transmission and reception of the data, the internal clock signal ICLK is re-controlled in real time, when the phase thereof is distorted depending on the result obtained by comparing the phase of the strobe signal STB and the phase of the fed-back internal clock signal ICLK. Then, the rising edge of the internal clock signal ICLK may be aligned at a desired position inside the effective window of the internal data DIN<0:N−1>. For example, the rising edge of the internal clock signal ICLK is aligned with the rising edge of the strobe signal STB. As a result, the data transmission and reception may be performed without a malfunction.

In the above-described semiconductor memory system in accordance with the second embodiment of the present invention, the number of circuits for the training operation of the strobe signal inside the semiconductor memory device may be minimized/reduced while transmitting/receiving the strobe signal effectively for example, without an error. Therefore, the semiconductor memory system may achieve high-integration while using a small area and accommodate design changes. Furthermore, the semiconductor memory system in accordance with the second embodiment of the present invention may effectively transmit and receive the data, the clock signal, and the strobe signal without an error, even though the frequency of the strobe signal increases as the data transmission rates increase.

In accordance with the embodiments of the present invention, the reliability of data transfer and sampling in a semiconductor memory device at a high speed may be improved to be within the range of an effective window by adjusting the internal clock signal in accordance with the strobe signal even while the data is transmitted and received.

Furthermore, the reception stage of a semiconductor memory device may sample data in the center of the effective window of the data, even though the timing of the internal clock signal of the semiconductor memory device is varied by changes in power supply voltage and temperature during the operation.

Furthermore, although a circuit for training the strobe signal inside the semiconductor memory device is not separately provided, the strobe signal may be transmitted and received effectively without an error. Therefore, the high integration of the semiconductor device may be accomplished, and the power consumption during the operation may be reduced.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
a strobe signal reception unit configured to receive a strobe signal and generate a tracking clock signal;
a clock reception unit configured to receive a clock signal and generate an internal clock signal;
a plurality of data reception units configured to receive parallel data in accordance with the internal clock signal and generate internal data; and
a phase control unit configured to control a phase of the internal clock signal to track the tracking clock signal and to compensate for a variation in the phase of the internal clock signal while the parallel data is received.

2. The semiconductor memory device of claim 1, wherein the phase control unit comprises:
a tracking section configured to determine a tracking of the tracking clock signal by the internal clock signal, and output an internal clock control signal depending on the tracking determination; and
a phase control section configured to control the phase of the internal clock signal in accordance with the internal clock control signal.

3. The semiconductor memory device of claim 2, wherein the tracking section receives the internal clock signal inputted to a data reception unit of the plurality of data reception units.

4. The semiconductor memory device of claim 3, wherein the data reception unit is positioned physically closest to the strobe signal reception unit among the plurality of data reception units.

5. The semiconductor memory device of claim 3, wherein the data reception unit receives the least significant bit (LSB) or the most significant bit (MSB) of the parallel data.

6. The semiconductor memory device of claim 2, wherein the tracking section comprises:
a phase detector configured to detect a phase difference between the tracking clock signal and the internal clock signal; and
a control signal generator configured to output the internal clock control signal depending on a detection result from the phase detector.

7. The semiconductor memory device of claim 2, wherein the phase control section comprises a phase interpolator.

8. The semiconductor memory device of claim 1, wherein the strobe signal comprises a signal having a rising edge aligned with a center of an effective window of the parallel data.

9. The semiconductor memory device of claim 1, further comprising:
a clock divider configured to divide the clock signal outputted from the clock reception unit and output the divided clock signal as the internal clock signal; and
a local router configured to route the internal clock signal outputted from the clock divider and supply the internal clock signal to the plurality of data reception units and the phase control unit.

10. A semiconductor system comprising first and second semiconductor chips for transmitting and receiving data, respectively,
wherein the first semiconductor chip comprises:
a plurality of data transmission units configured to output a plurality of parallel data;
a clock transmission unit configured to output a clock signal; and
a strobe signal transmission unit configured to output a strobe signal, and
the second semiconductor chip comprises:
a strobe signal reception unit configured to receive the strobe signal and generate a tracking clock signal;
a clock reception unit configured to receive the clock signal and generate an internal clock signal;
a plurality of data reception units configured to receive the parallel data in accordance with the internal clock signal and generate internal data; and a phase control unit configured to control a phase of the internal clock signal to track the tracking clock signal.

11. The semiconductor system of claim 10, wherein the phase control unit comprises:
   a tracking section configured to determine a tracking of the tracking clock signal by the internal clock signal, and output an internal clock control signal depending on the tracking determination; and
   a phase control section configured to control the phase of the internal clock signal in accordance with the internal clock control signal.

12. The semiconductor system of claim 11, wherein the tracking section is configured to receive the internal clock signal inputted to a data reception unit among the plurality of data reception units.

13. The semiconductor system of claim 12, wherein the tracking section comprises:
   a phase detector configured to detect a phase difference between the tracking clock signal and the internal clock signal; and
   a control signal generator configured to output the internal clock control signal depending on a detection result from the phase detector.

14. The semiconductor system of claim 10, wherein the first semiconductor chip further comprises:
   a clock generator configured to receive a reference clock signal and generate the clock signal and a multi-phase clock signal;
   a plurality of first phase controllers configured to control phases of the parallel data in response to a plurality of first phase control signals and the multi-phase clock signal; and
   a second phase controller configured to control a phase of the strobe signal in response to a second phase control signal and the multi-phase clock signal.

15. The semiconductor system of claim 14, wherein the clock generation unit is one of a phase locked loop (PLL) circuit and a delay locked loop (DLL) circuit, and the first and second phase controllers comprise a phase interpolator (PI).

16. The semiconductor system of claim 14, wherein the second phase controller is configured to control the phase of the strobe signal such that a rising edge of the strobe signal is aligned with a center of an effective window of the parallel data.

17. The semiconductor system of claim 14, wherein the second phase controller is configured to receive a first phase control signal inputted to a data transmission unit of the first semiconductor chip connected to a data reception unit of the second semiconductor chip as the second phase control signal.

18. The semiconductor system of claim 14, wherein the first and second phase control signals are control signals that are determined during data training of an initial period before performing the transmission and reception of data in response to a command inputted after the initial period.

19. The semiconductor system of claim 14, wherein the second semiconductor chip further comprises a data training unit configured to receive the internal data outputted from the plurality of data reception units and output training data during an initial period, and
   the first semiconductor chip further comprises a training control unit configured to receive the training data inputted from the data training unit and generate the first and second phase control signals during the initial period.

20. The semiconductor system of claim 19, wherein the data training unit comprises:
   a register configured to receive and store the internal data outputted from the plurality of data reception units;
   a serializer configured to serialize and output the internal data stored in the register; and
   a transmitter configured to receive the output of the serializer and transmit the training data to the first semiconductor chip.

21. The semiconductor system of claim 10, further comprising:
   a clock divider configured to divide the internal clock signal outputted from the clock reception unit; and
   a local router configured to route an output of the clock divider and supply the output to the plurality of data reception units and the phase control unit.

22. A data input/output method for a semiconductor system, which transmits and receives data between first and second semiconductor chips, the data input/output method comprising:
   transmitting a plurality of parallel data, a clock signal, and a strobe signal from the first semiconductor chip to the second semiconductor chip;
   receiving the strobe signal and generating a tracking clock signal;
   receiving the clock signal and generating an internal clock signal;
   receiving the parallel data in accordance with the internal clock signal and generating internal data; and
   controlling a phase of the internal clock signal to track the tracking clock signal and compensating for a variation in the phase of the internal clock signal while the parallel data is transmitted and received.

23. The data input/output method of claim 22, wherein the controlling of the phase of the internal clock signal comprises:
   detecting a phase difference between the tracking clock signal and the internal clock signal, and outputting an internal clock control signal; and
   compensating for the phase of the internal clock signal in accordance with the internal clock control signal.

24. The data input/output method of claim 22, wherein, as the internal clock signal, an internal clock signal inputted for being used in receiving a data among the plurality of parallel data is used.

25. The data input/output method of claim 24, further comprising:
   receiving, by the first semiconductor chip, a reference clock signal and generating the clock signal and a multi-phase clock signal;
   controlling phases of the parallel data in response to a plurality of first phase control signals and the multi-phase clock signal; and
   controlling a phase of the strobe signal in response to a second phase control signal and the multi-phase clock signal.

26. The data input/output method of claim 25, wherein, in the controlling of the phase of the strobe signal, the phase of the strobe signal is controlled in such a manner that a rising edge of the strobe signal is aligned with a center of an effective window of the parallel data.

27. The data input/output method of claim 25, wherein, in the controlling of the phase of the strobe signal, a first phase control signal for controlling the phase of the parallel data among the plurality of first phase control signals is received as the second phase control signal.

28. The data input/output method of claim 25, wherein the first and second phase control signals are determined in accordance with data training of an initial period before performing the transmission and reception of data in response to a command inputted after the initial period.

29. The data input/output method of claim 25, further comprising:
    receiving the internal data of the second semiconductor chip and outputting training data to the first semiconductor chip during an initial period before data is transmitted and received in response to an inputted command; and
    receiving, by the first semiconductor chip, the training data and generating the first and second phase control signals.

30. The data input/output method of claim 29, wherein the receiving of the internal data comprises:
    receiving and storing the internal data;
    serializing and outputting the stored data; and
    transmitting the serialized data as the training data to the first semiconductor chip.

31. The data input/output method of claim 22, further comprising:
    dividing the inputted clock signal and outputting the divided clock signal as the internal clock signal; and
    routing the divided internal clock signal.

* * * * *